United States Patent
Rabe et al.

(10) Patent No.: US 6,573,718 B2
(45) Date of Patent: Jun. 3, 2003

(54) FEEDBACK CONTROLLED MAGNETIC RESONANCE APPARATUS AND METHOD FOR OPERATING SAME

(75) Inventors: Frank Rabe, Erlangen (DE); Helmut Ziegler, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/896,678

(22) Filed: Jun. 29, 2001

(65) Prior Publication Data

US 2002/0067165 A1 Jun. 6, 2002

(30) Foreign Application Priority Data

Jun. 29, 2000 (DE) .......................................... 100 31 705

(51) Int. Cl.⁷ .................................................. G01V 3/00
(52) U.S. Cl. ......................................... 324/309; 324/318
(58) Field of Search ................................. 324/309, 307, 324/318, 320, 322

(56) References Cited

U.S. PATENT DOCUMENTS 6,195,579 B1 * 2/2001 Carroll et al. ............... 324/306
6,198,287 B1    3/2001 Heiserholt et al.
6,298,258 B1 * 10/2001 Heid et al. .................. 324/307
6,348,793 B1 * 2/2002 Balloni et al. .............. 324/309

OTHER PUBLICATIONS

"A Real–Time NMR Image Reconstruction System Using Echo–Planar Imaging and a Digital Signal Processor," Kose et al., Meas. Sci. Tech. No. 3, (1992) pp. 1161–1165.

* cited by examiner

Primary Examiner—Edward Lefkowitz
Assistant Examiner—Dixomava Vargas
(74) Attorney, Agent, or Firm—Schiff Hardin & Waite

(57) ABSTRACT

In a magnetic resonance apparatus and a method for the operation of a magnetic resonance apparatus, the measured data generating unit sends additional control information to the measured data evaluation unit, and the measured data evaluation unit sends feedback information to the measured data acquisition unit. The feedback information influences the generation of measured data in the measured data generation unit.

16 Claims, 1 Drawing Sheet

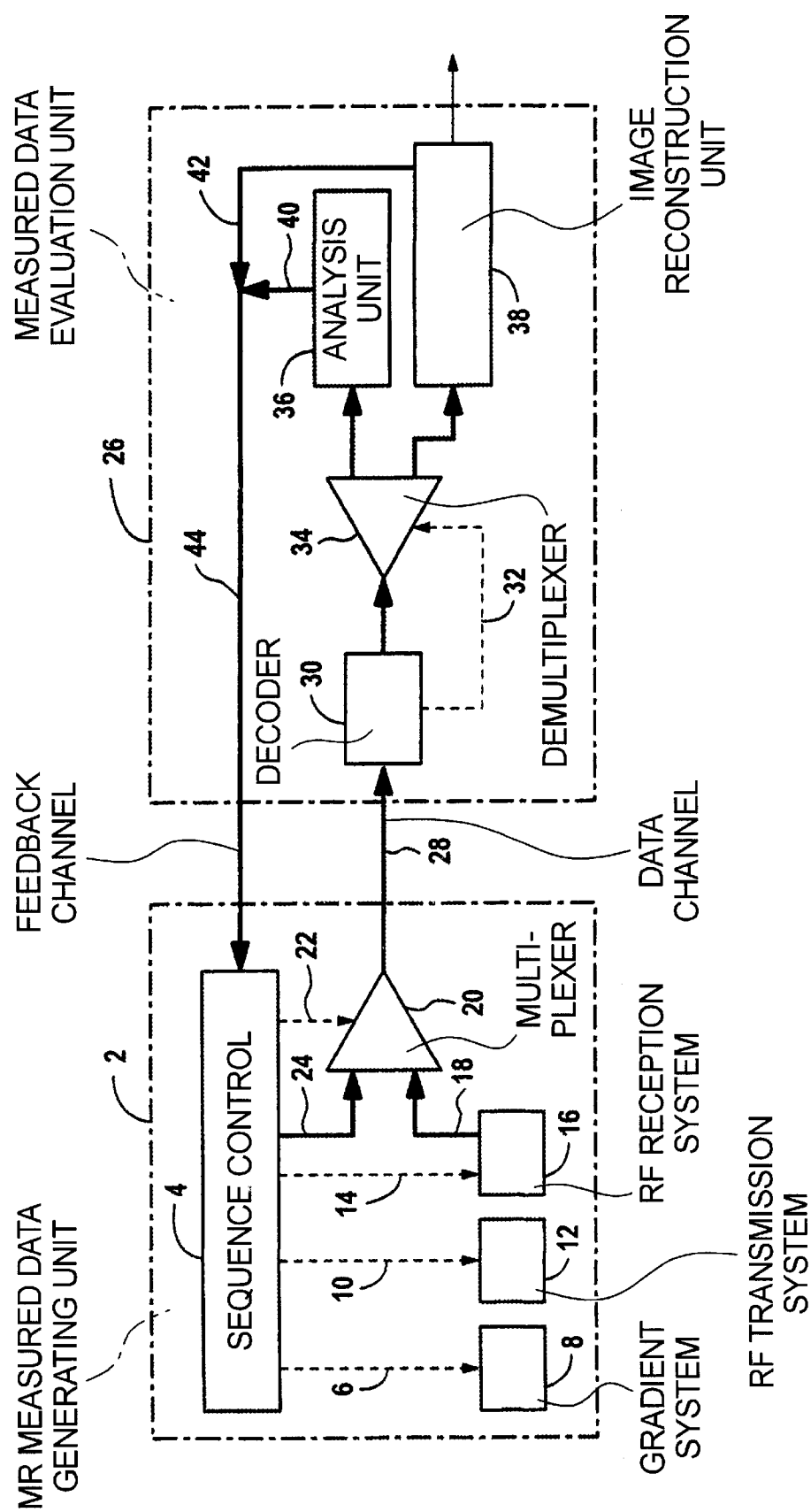

FEEDBACK CONTROLLED MAGNETIC RESONANCE APPARATUS AND METHOD FOR OPERATING SAME

BACKGROUND OF THE INVENTION

1. Field of the Invention

The present invention is directed to a magnetic resonance apparatus and to a method for the operation of a magnetic resonance apparatus of the type having a unit for generating measured data and a unit for evaluating the measured data, wherein the measured data generating unit sends magnetic resonance raw data to the measured data evaluation unit.

2. Description of the Prior Art

For generating images with nuclear magnetic resonance, magnetic resonance signals are location-encoded with magnetic gradient fields before and during their reception. Such location encoding means that a mathematical domain known as k space is occupied with signals k space is defined by the time integral of the gradient fields. The signals in k space are then subjected to a Fourier transformation, the result of which is supplied to an image display.

The sampling of k space and the reconstruction of the images defined therewith on the basis of the acquired measured data ensue according to a fixed strategy that is defined and set before the beginning of the measurement.

In physiologically controlled measurements (for example, controlled by ECG, respiration or pulse), a time profile or template is transmitted from the measured data generating unit to the measured data evaluation unit in addition to the digitized magnetic resonance data. This information indicates the time reference of the generation of the magnetic resonance data with respect to a selected reference point of the physiological signal. The magnetic resonance data registered over many cycles of the physiological signal thus can be allocated to identical time intervals of the physiological signal in the measured data evaluation unit. This also enables the acquisition of magnetic resonance images of predominantly periodically moving subjects, which is also referred to as retrogating.

There are also methods wherein further magnetic resonance data are generated at previously defined intervals in addition to the k space data in order to control the image reconstruction therewith. Parallel to the sampling of k space for the actual image generation, thus, the data of one or more further k spaces can be acquired in time-division multiplex so that, for example, the position of the diaphragm of a patient can be recognized on the basis of the existing supplementary data. The respiration can in turn be tracked therefrom and motion artifacts can be compensated.

SUMMARY OF THE INVENTION

An object of the invention is to provide a magnetic resonance apparatus and a method for the operation of a magnetic resonance apparatus with improved measured data or image data pickup.

This object is achieved in a method and apparatus wherein the measured data generating unit sends additional control information to the measured data evaluation unit, the measured data evaluation unit sends feedback information to the measured data acquisition unit, and the feedback information influences the generation of measured data in the measured data generation unit. It is thus possible for the unit that evaluates the measured data to influence the k space sampling during the acquisition of the measured data. With such a fast feedback, having a dead time preferably below the repetition time of the sampling of the k-space rows, flexible control loops can be constructed for improving image quality. For example, a repetition of the sampling of k-space rows can be prescribed by modification of parameters until a desired quality feature such as, for example, the signal-to-noise ratio of the measured data is achieved. Another exemplary application is to control the k-space sampling in abdomen imaging or functional imaging so that motion artifacts are reduced. In another application, the measurement field is automatically shifted by an image-controlled tracking of a catheter or a biopsy needle, so that these subjects are always imaged in the middle of a graphic presentation of the examination region despite their change in position in this region.

In an embodiment, the control information is generated from a predetermined magnetic resonance measurement sequence. This measurement sequence specifies individual control information for every sampled k-space row. The additional row information is transmitted to the measured data evaluation synchronously with the measured raw data.

In a further embodiment, the control information controls the processing of the raw data of the k-space rows in the evaluation of the measured data. The raw data are supplied to an image reconstruction stage and/or to a specific data evaluation stage.

The measurement sequence can react to feedback information from the measured data evaluation at any time during the run time of the measurement. The reaction is thereby predetermined at the sequence side. In an embodiment, the feedback information is employed for the generation of the gradient control signals and/or the transmission system control signals and/or the reception system control signals. The reaction time thereby preferably lies below the typical repetition time of the sampling of the k-space row, i.e. the time that is required for generating the data for a k-space row.

The data channel from the measured data evaluation to the measured data generating unit is fashioned such that, in addition to a high bandwidth, for example 100 MB/s, a slight and deterministic dwell or delay time, is guaranteed in the data transmission, for example on the order of magnitude of 4 through 4 Ms.

DESCRIPTION OF THE DRAWING

The single FIGURE is a block diagram of a magnetic resonance apparatus constructed and operating in accordance with the principles of the present invention.

DESCRIPTION OF THE PREFERRED EMBODIMENTS

In the form of a block circuit diagram, the FIGURE shows those function units of a conventional diagnostic magnetic resonance apparatus that must be modified for implementing the inventive fast feedback method. The diagnostic magnetic resonance apparatus has a measured data generating unit 2 that contains all components required for the excitation and reception of magnetic resonance signals as well as for the location encoding of these signals.

The measured data generating unit includes a measurement sequence control 4 that generates control signals from a magnetic resonance measurement sequence while it is being run. The magnetic resonance measurement sequence is implemented, for example, as C++ program that sequences within the measured data generating unit 2 under a real-time operating system, for example VxWorks. First control signals 6 are generated for controlling a gradient system 8, which comprises amplifiers and magnetic coils. The measurement sequence control 4 also generates second control signals for a radio frequency transmission system 12. The radio frequency transmission system 12 has a radio frequency power amplifier and an antenna. Finally, third control signals 14 are generated from the magnetic resonance measurement sequence 4 for a radio frequency reception system 16 that comprises a reception antenna with following pre-amplifiers as well as a digitalization unit. The received magnetic resonance signals are thus present in digital form as magnetic resonance raw data 18 for further-processing.

The measured data generating unit 2 having the above-described conventional components of the magnetic resonance apparatus is modified by a multiplexer 20. The multiplexer 20 likewise receives control signals 22 that the measurement sequence control 4 generates from the magnetic resonance measurement sequence. Controlled by the control signals 22, the multiplexer 20 attaches k-space row-specific control information 24 for a subsequent measured data evaluation to the digitized magnetic resonance raw data 18.

The magnetic resonance raw data 18 are synchronously transmitted to a measured data evaluation unit 26 as packet with the appertaining control information 24. To that end, a data connection 28, for example in the form of a light waveguide link, is provided between the measured data generating unit 2 and the measured data evaluation unit 2, the magnetic resonance raw data 18 together with the row-specific control information 24, this transmission ensuing with a serial protocol. The measured data evaluation also ensues program-controlled, for example under the operating system Windows NT. The measured data evaluation unit 26 has a decoder wherein a control signal 32 for the control of a demultiplexer 34 is generated. The incoming magnetic resonance raw data are then supplied by the demultiplexer 34 either to a raw data analysis unit 36 and/or to an image reconstruction unit 38 dependent on the control signal 32. The raw data analysis unit 36 generates first feedback information 40, and the image reconstruction unit 38 generates second feedback information 42, both of which are supplied via a feedback channel 44 to the measurement sequence control 4 in order to intervene in the running of the sequence. The feedback channel 44 is, for example, designed as a standard Ethernet connection with TCP/IP protocol. For adhering to the real-time demands made of the dead time of the feedback, the raw data evaluation unit 36 runs as a real-time process given employment of Windows NT.

For example, the feedback information can cause a repetition of the sampling of k-space rows, whereby the parameters are modified at the excitation side until a desired quality feature such as, for example, a minimum signal-to-noise ratio of the measured data is achieved. Another application is the control of the k-space sampling such that motion artifacts are reduced, for example in abdomen imaging or in functional imaging. A further control can ensue using the feedback information to cause a catheter or a biopsy needle always to be displayed in the middle of an image despite a positional change in the examination region.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method for operating a magnetic resonance apparatus comprising the steps of:

generating measured data, including magnetic resonance raw data, in a magnetic resonance measured data generating unit;

generating control information in said magnetic resonance measured data generating unit relating to the generation of said magnetic resonance raw data in said magnetic resonance measured data generating unit;

transmitting said magnetic resonance raw data together with said control information to a data evaluation unit;

analyzing at least said control information in said data evaluation unit and producing feedback information therefrom in said data evaluation unit; and transmitting said feedback information from said data evaluation unit to said magnetic resonance measured data generating unit and altering the generation of said magnetic resonance raw data in said magnetic resonance measured data generating unit dependent on said feedback information.

2. A method as claimed in claim 1 wherein the step of generating said measured data, including said magnetic resonance raw data, comprises generating said magnetic resonance raw data as a series of k-space rows, with a repetition time for generating the magnetic resonance raw data respectively for the k space rows, and wherein the step of altering the generation of said measured data dependent on said feedback information comprises altering the generation of said measured data dependent on said feedback information with a maximum dead time that is less than said repetition time.

3. A method as claimed in claim 1 wherein the step of generating said measured data, including said magnetic resonance raw data, in said magnetic resonance measured data generating unit comprises generating said measured data using a measurement sequence which operates said magnetic resonance measured data generating unit, and wherein the step of generating said control information comprises generating said control information from a predetermined measurement sequence.

4. A method as claimed in claim 1 wherein the step of generating said measured data, including said magnetic resonance raw data, in said magnetic resonance measured data generating unit comprises generating said magnetic resonance raw data as a plurality of successive k space rows, and wherein said magnetic resonance measured data generating unit samples the respective k space rows to obtain sampled k space row data, and wherein said magnetic resonance measured data generating unit transmits said control information together with said sampled k space row data to said data evaluation unit.

5. A method as claimed in claim 1 wherein the step of generating said measured data, including magnetic resonance raw data, in said magnetic resonance measured data generating unit comprises generating said magnetic resonance raw data as a series of k space rows respectively containing magnetic resonance raw data, and comprising the step of processing said k space row raw data in said data evaluation unit dependent on said control information.

6. A method as claimed in claim 1 wherein the step of generating said measured data, including said magnetic resonance raw data, in said magnetic resonance measured data generating unit comprises generating said magnetic resonance raw data as successive k space rows respectively containing magnetic resonance raw data, and wherein said data evaluation unit includes an image reconstruction unit, and comprising the step of supplying said k space row raw data to said image reconstruction unit and generating a magnetic resonance image in said image reconstruction unit from said k space row raw data.

7. A method as claimed in claim 6 comprising generating said feedback information in said image reconstruction unit.

8. A method as claimed in claim 6 comprising analyzing said control information in an analysis unit, separate from said image reconstruction unit, and generating said feedback information in said analysis unit.

9. A method as claimed in claim 1 wherein the step of generating said measured data, including said magnetic resonance raw data, in said magnetic resonance measured data generating unit comprises operating a gradient coil with a gradient control signal, operating an RF transmission system with a transmission system control signal, operating an RF reception system with a reception system control signal to obtain said magnetic resonance raw data as successive k space rows respectively containing raw data, and transmitting said k space row raw data to said data evaluation unit synchronized with said control information using a synchronrization control signal.

10. A method as claimed in claim 9 comprising employing said feedback information for generating at least one of said gradient control signal, said transmission system control signal, said reception system control signal, and said synchronization control signal.

11. A magnetic resonance apparatus comprising:

a magnetic resonance measured data generating unit which generates measured data, including magnetic resonance raw data and for generating control information relating to the generation of said magnetic resonance raw data;

a measured data evaluation unit connected to said magnetic resonance measured data generating unit by a data channel via which said magnetic resonance raw data and said control information are supplied from said magnetic resonance measured data generating unit to said data evaluation unit;

a unit in said measured data evaluation unit which generates a feedback signal from said magnetic resonance raw data and said control information; and a feedback channel connecting said data evaluation unit to said magnetic resonance measured data generating unit via which said feedback signal is supplied to said magnetic resonance measured data generating unit, said feedback signal altering the generation of said magnetic resonance raw data in said magnetic resonance measured data generating unit.

12. A magnetic resonance apparatus as claimed in claim 11 wherein said magnetic resonance data generating unit generates said magnetic resonance raw data in a plurality of successive data groups, and wherein said magnetic resonance measured data generating unit includes a multiplexer having an output connected to said data channel for synchronizing said control information with said data groups for transmission via said data channel to said data evaluation unit.

13. A magnetic resonance apparatus as claimed in claim 12 wherein said magnetic resonance measured data generating unit generates said magnetic resonance raw data as successive k space rows, said successive k space rows forming said data groups.

14. A magnetic resonance apparatus as claimed in claim 12 wherein said data evaluation unit comprises a decoder connected to said data channel for decoding said control information, and a demultiplexer connected to said decoder for producing a demultiplexing control signal, and a demultiplexer, supplied with said control information and said magnetic resonance raw data from said decoder, and supplied with said demultiplexing control signal from said decoder, for demultiplexing said control information and said magnetic resonance raw data using said demultiplexing control signal.

15. A magnetic resonance apparatus as claimed in claim 14 further comprising an image reconstruction unit and an analysis unit connected to an output of said demultiplexer, each of said image reconstruction unit and said raw data evaluation unit being supplied with at least one of said magnetic resonance raw data and said control information from said demultiplexer, and at least one of said raw data analysis unit and said image reconstruction unit generating said feedback signal.

16. A magnetic resonance apparatus as claimed in claim 11 wherein said magnetic resonance measured data generating unit includes a gradient system operating with a gradient control signal, an RF transmission system operating with a transmission system control signal, an RF reception system operating with a reception system control unit, and a multiplexer supplied with said magnetic resonance raw data from said RF reception system and also supplied with said control information for synchronizing said magnetic resonance raw data with said control information using a synchronization control signal, and a measurement sequence control unit connected to said gradient system, said RF transmission system, said RF reception system and to said multiplexer for generating said gradient system control signal, said transmission system control signal, said reception system control signal, said synchronization control signal and said control information, and connected to said feedback channel, said control unit altering at least one of said gradient control signal, said transmission system control signal, said reception system control signal and said synchronization control signal dependent on said feedback signal.

* * * * *